(12) United States Patent
Aggarwal et al.

(10) Patent No.: US 9,865,335 B2
(45) Date of Patent: *Jan. 9, 2018

(54) SRAM DEVICE CAPABLE OF WORKING IN MULTIPLE LOW VOLTAGES WITHOUT LOSS OF PERFORMANCE

(71) Applicant: TAIWAN SEMICONDUCTOR MANUFACTURING COMPANY LTD., Hsinchu (TW)

(72) Inventors: Pankaj Aggarwal, Hsinchu County (TW); Jui-Che Tsai, Tainan (TW); Cheng Hung Lee, Hsinchu (TW); Chien-Yuan Chen, Hsinchu (TW); Chiting Cheng, Taichung (TW); Hau-Tai Shieh, Hsinchu (TW); Yi-Tzu Chen, Hsinchu (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/424,236

(22) Filed: Feb. 3, 2017

(65) Prior Publication Data

US 2017/0148508 A1 May 25, 2017

Related U.S. Application Data

(63) Continuation of application No. 14/872,493, filed on Oct. 1, 2015, now Pat. No. 9,583,181.

(51) Int. Cl.
*G11C 11/00* (2006.01)
*G11C 11/419* (2006.01)
*G11C 11/413* (2006.01)
*G11C 11/412* (2006.01)

(52) U.S. Cl.
CPC .......... *G11C 11/419* (2013.01); *G11C 11/412* (2013.01); *G11C 11/413* (2013.01)

(58) Field of Classification Search
CPC .... G11C 11/419; G11C 11/412; G11C 11/413
See application file for complete search history.

(56) References Cited

U.S. PATENT DOCUMENTS

| 8,605,523 B2 | 12/2013 | Tao et al. |
| 8,630,132 B2 | 1/2014 | Cheng et al. |
| 8,760,948 B2 | 6/2014 | Tao et al. |
| 8,908,421 B2 | 12/2014 | Liaw |
| 8,929,160 B2 | 1/2015 | Katoch et al. |
| 8,964,492 B2 | 2/2015 | Hsu et al. |
| 8,982,643 B2 | 3/2015 | Lum |

(Continued)

*Primary Examiner* — Toan Le
(74) *Attorney, Agent, or Firm* — WPAT, P.C., Intellectual Property Attorneys; Anthony King

(57) ABSTRACT

A memory device comprises a tracking control circuit for controlling the write operation or the read operation of the memory device. The tracking control circuit comprises a plurality of tracking cells, wherein the timing characteristics of the tracking cells emulate the timing characteristics of a bit cell during a write operation or a read operation of the memory device. The memory device further comprises at least two reference word lines for configuring the number of tracking cells of the tracking control circuit; and a selection circuit configured to activate one or more of the at least two reference word lines.

20 Claims, 8 Drawing Sheets

(56) References Cited

U.S. PATENT DOCUMENTS

| | | | |
|---|---|---|---|
| 9,117,510 B2 | 8/2015 | Yang et al. | |
| 9,208,858 B1 | 12/2015 | Lin et al. | |
| 9,218,872 B1 | 12/2015 | Liaw | |
| 9,583,181 B1* | 2/2017 | Aggarwal | G11C 11/412 |
| 2013/0094309 A1* | 4/2013 | Wang | G11C 11/419 |
| | | | 365/191 |
| 2014/0153345 A1 | 6/2014 | Kim et al. | |
| 2014/0233330 A1 | 8/2014 | Ko et al. | |
| 2015/0213881 A1* | 7/2015 | Rai | G11C 7/227 |
| | | | 365/154 |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |
| 2016/0086657 A1* | 3/2016 | Hong | G11C 11/417 |
| | | | 365/154 |

\* cited by examiner

SRAM DEVICE CAPABLE OF WORKING IN MULTIPLE LOW VOLTAGES WITHOUT LOSS OF PERFORMANCE

CROSS-REFERENCE TO RELATED APPLICATIONS

This application is a continuation of U.S. application Ser. No. 14/872,493, filed Oct. 1, 2015, and claims priority thereto.

TECHNICAL FIELD

The present disclosure is generally related to structures of static random access memory (SRAM) that can support multi-voltage operations without loss of performance.

BACKGROUND

Electronic devices such as notebook, computers and smartphones usually include a variety of memories to store data. The types of memories can be divided into two categories: volatile memories and non-volatile memories. Data stored in volatile memories will be lost after the power of the volatile memories is removed. On the contrary, data stored in the non-volatile memories may retain even if the power is removed. Volatile memories include random access memory (RAM), which may be further divided into two sub-categories: static random access memory (SRAM) and dynamic random access memory (DRAM).

An SRAM memory unit is constituted by a plurality of SRAM cells. Each of the SRAM cells may include different numbers of transistors. An SRAM cell consisting of six transistors is referred to as a six-transistor (6-T) SRAM, for example. In an SRAM memory chip, SRAM cells may be arranged in rows and columns. An SRAM cell is selected during either a read operation or a write operation by selecting the cell's row and column. In manufacturing of the SRAM, each of the SRAM cells is designed to work at a specific voltage. Only in that specific voltage can the SRAM work at an expected speed and accuracy.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
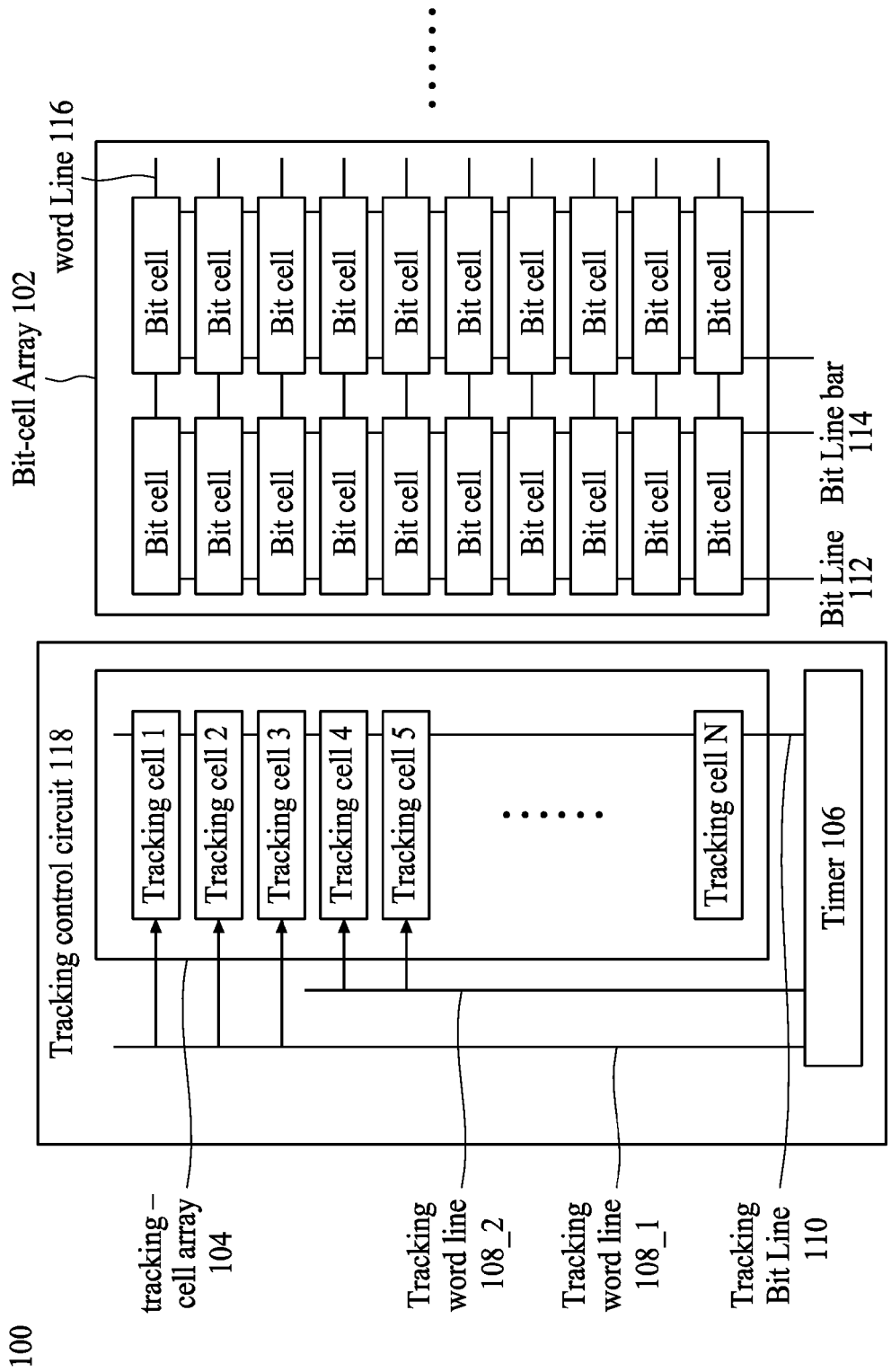
FIG. 1 is a schematic diagram of an SRAM memory unit, in accordance with some embodiments of the subject application.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. It will be understood that when an element is referred to as being "connected to" or "coupled with" another element, it may be directly connected to or coupled to the other element, or intervening elements may be present.

A tracking circuit is utilized by a memory unit to track and control aspects of the read operation and the write operation. The tracking circuit includes a plurality of tracking cells, where the plurality of tracking cells are arranged in a column. The tracking cells each has its timing characteristics that emulate the SRAM array during the read operation and the write operation. Particularly, the tracking circuit is used for simulating the data write operation and the data read operation of a memory cell so as to generate a time sequence control signal, and the accurate time sequence control of an SRAM data write and data read routes can be realized.

As previously discussed, an SRAM memory unit is designed to work at a specific voltage range. Only in that specific voltage range can the SRAM memory unit work at the expected speed and accuracy. For example, the performance of an SRAM memory unit designed to work at 2 Volts will be degraded if it is forced to work at 400 millivolts. Additionally, when an SRAM memory unit needs to operate at a voltage other than the designed voltage, the tracking circuit of the SRAM memory unit also needs to be adjusted in order to guarantee the correct read operation and the write operation.

It will increase the flexibility of the usage of an SRAM memory unit if the SRAM memory unit can work at more than one specific voltages. Some existing architectures may utilize more than one tracking bit lines to achieve this goal. However, the structure of additional tracking bit lines inevitably requires additional area of tracking cells for the SRAM memory unit, since a tracking bit line is accompanied with a plurality of tracking cells arranged in a column. The significant area impact is not welcomed by any designer of memory structures, in particular in view of the downsizing trend in semiconductor manufacturing.

FIG. 1 is a schematic diagram of an SRAM memory unit 100, in accordance with some embodiments of the subject application. As shown in FIG. 1, the SRAM memory unit 100 comprises a bit-cell array 102 and a tracking control circuit 118.

Bit-cell array 102 comprises a plurality of bit cells. Data can be written to or read from these bit cells. In the read operation, for example, if the data stored in the top left bit cell of bit-cell array 102 needs to be read out, a bit line 112 and a bit line bar 114 associated with the bit cell will be pre-charged in the first place. Once the word line 116 turns on, data stored in the bit cell will be read by one of the bit line 112 and the bit line bar 114. On the other hand, in the write operation, for example, if a new data needs to be stored in the top left bit cell of bit-cell array 102, in the first place, one of the associated bit line 112 and the bit line bar 114 is driven to logical high and the other is driven to logical low. Once the word line 116 turns on, the new data will be written through the associated bit line 112 and the bit line bar 114.

The tracking control circuit 118 comprises a tracking-cell array 104 and a timer 106. The tracking-cell array 104 comprises a plurality of tracking cells, for example, tracking cell 1 to tracking cell N, N being a natural number. The plurality of tracking cells are connected to a timer 106 through a tracking bit line 110.

Each of the tracking cells of the tracking-cell array 104 may have a same structure as the bit cells of the bit-cell array 102, and therefore may have a timing characteristic that emulates a timing characteristic of the bit-cell array 102 during the write operation or the read operation. Based on the timing characteristic of the plurality of tracking cells, the timer 106 can generate signals (not shown) for the tracking control circuit 118 to control the write operation and the read operation of the bit-cell array 102.

The tracking cell array 104 and the tracking control circuit 118 are designed to guarantee correct read operation or write operation of bit cell array 102. In the embodiment shown in FIG. 1, the tracking control circuit 118 has two configurable tracking word lines 108_1 and 108_2. The tracking word line 108_1 is connected to tracking cells 1 to 3, and tracking word line 108_2 is connected to tracking cells 4 and 5. The tracking control circuit 118 is able to select one of the tracking word lines 108_1 and 108_2 for controlling read operation or write operation in different conditions.

For a tracking control circuit, the number of the tracking cells connected by a tracking word line would be determined by the time required to complete the read operation or the write operation of the bit cell array. For example, if the cycle time of a bit cell array is dominated by the write operation (i.e., the time required to complete the write operation is longer than the time required to complete the read operation), the number of the tracking cells within the tracking-cell array will be designed to guarantee the correct write operation of the bit cell array. In general, the longer the cycle time of the bit cell array, the more number of the tracking cells within the tracking-cell array will be required to maintain optimum speed, and vice versa.

In some existing approaches, an SRAM memory unit is designed to work at a specific voltage. In that case, the number of tracking cells connected by the tracking word line within the tracking-cell array would be a fixed number. For example, for such an SRAM memory unit, only tracking cells 1 to 3 are connected by a tracking word line, while the other tracking cells are not connected by any tracking word line.

When the SRAM memory unit is forced to work at a voltage different than the specific voltage, the tracking-cell array and the timer within the SRAM memory unit would not be able to generate correct signals for controlling the write operation and the read operation of bit-cell array. For example, if in an existing approach an SRAM memory unit is designed to work at 2 Volts, when it is forced to work at 4 Volts, the number of tracking cells needs to be increased in order to maintain optimum speed, because the time required for a 4-Volt signal to fall from logical high to logical low, or to rise from logical low to logical high increases. On the contrary, if the SRAM memory unit is designed to work at 2 Volts, when it is forced to work at 400 millivolts, the number of tracking cells needs to be decreased.

Figure 2:
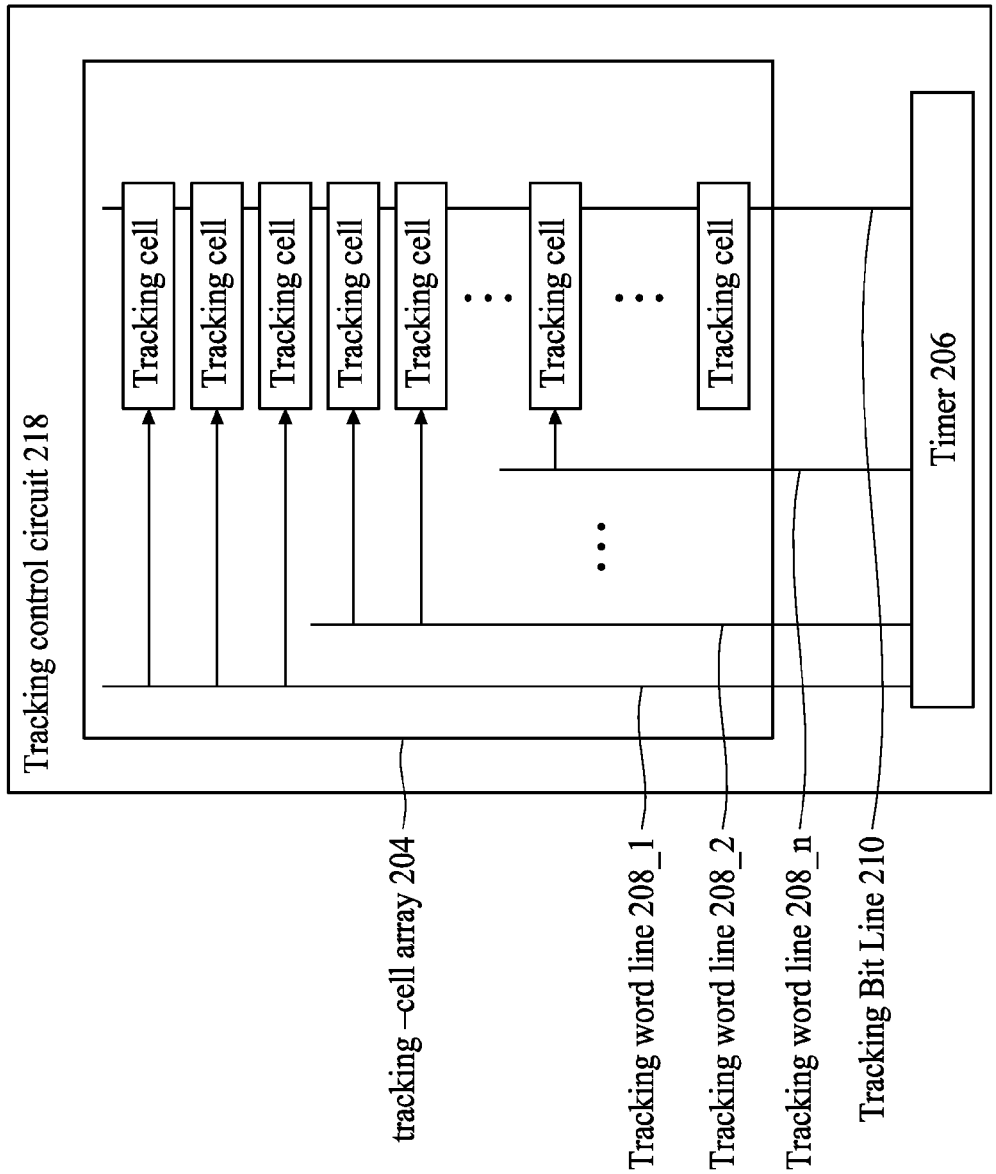
FIG. 2 is a schematic diagram of a tracking control circuit, in accordance with some embodiments of the subject application.

FIG. 2 is a schematic diagram of a tracking control circuit 218 in accordance with some embodiments of the subject application. Referring to FIG. 2, the tracking control circuit 218 comprises a tracking-cell array 204 and a timer 206. Moreover, the tracking control circuit 218 has multiple configurable tracking word lines 208_1 to 208_n. As shown in FIG. 2, the tracking cell array 204 comprises a plurality of tracking cells. A tracking bit line 210 connects all the tracking cells to the timer 206. Each of the tracking word lines 208_1 to 208_n can be configured to connect a different number of tracking cells. For example, in the example illustrated in FIG. 2, tracking word lines 208_1 is connected to three tracking cells, tracking word lines 208_2 is connected to two tracking cells, and tracking word lines 208_n is connected to only one tracking cell.

In an embodiment, the tracking control circuit 218 can determine the number of tracking cells to be utilized for respectively controlling read and write operations. For example, if an SRAM memory unit is designed to work at only one specific voltage, the tracking control circuit 218 may select the tracking word line 208_1 for controlling the read operation of the SRAM memory unit, and select the tracking word line 208_2 for controlling the write operation of the SRAM memory unit. Utilization of different number of tracking cells for emulating the timing characteristics of read operation and write operation can guarantee both read and write of the SRAM memory unit to operate as expected.

In addition, since the write operation usually takes more time than the read operation in an SRAM memory unit, the cycle time of the SRAM memory unit is usually dominated by the write operation. Utilizing more tracking cells on the write operation than the read operation can eliminate the cycle time impact caused by the bit line pre-charge time of the write operation.

In an embodiment, utilization of different number of tracking cells can enable an SRAM memory unit to work at more than one specific voltages. For example, assume that the SRAM memory unit is designed to work at 2 Volts and 400 millivolts. In the case that the SRAM memory unit works at 2 Volts, the tracking control circuit 218 may select the tracking word line 208_1 for controlling the read or write operation. On the other hand, in the case that the SRAM memory unit works at 400 millivolts, the tracking control circuit 218 may select the tracking word line 208_n for controlling the read or write operation.

In additional, it should be understood that, to meet different applications, the tracking control circuit 218 may select more than one tracking word lines at a time. For example, if the timing characteristic of an SRAM memory unit is relatively slow, the tracking control circuit 218 may select both tracking word lines 208_1 and 208_2 for controlling the read or write operations of the SRAM memory unit. As a result, the tracking control circuit 218 enables an SRAM memory unit to operate at different power domains and provides more flexibility in an access operation of the SRAM memory unit.

Figure 3:
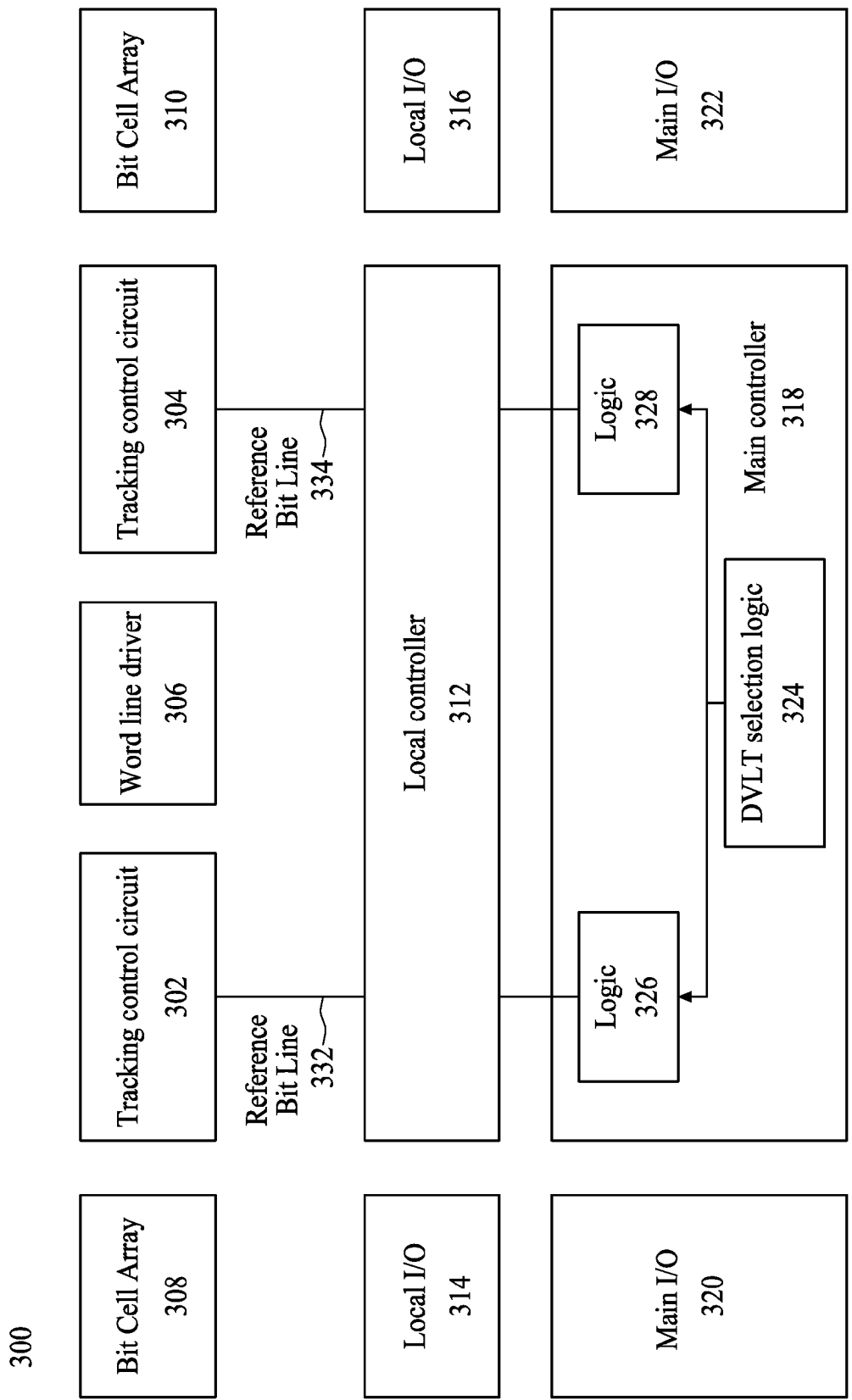
FIG. 3 is a schematic diagram of an SRAM memory unit that is able to work at two distinct voltages, in accordance with some embodiments of the subject application.

FIG. 3 is a schematic diagram of an SRAM memory unit 300 that is able to work at two distinct voltages, in accordance with some embodiments of the subject application. Referring to FIG. 3, the SRAM memory unit 300 comprises two tracking control circuits 302 and 304. The SRAM memory unit 300 further comprises a word line driver 306, bit cell arrays 308 and 310, a local controller 312, local I/Os 314 and 316, a main controller 318, and main I/Os 320 and 322. The word line driver 306 is configured to drive a word line for corresponding bit cells within the bit cell arrays 308 and 310 to be accessed during a read or a write operation. The local controller 312 is configured to control the local I/Os 314 and 316 to transfer data within the SRAM memory unit 300. The main controller 318 is configured to control the main I/Os 320 and 322 to transfer data between the SRAM memory unit 300 and other circuits outside of the SRAM memory unit 300.

A dual voltage (DVLT) selection logic 324 in the main controller 318 enables a user to select one of the tracking control circuits 302 and 304 for the SRAM memory unit 300 to operate. For example, the DVLT selection logic 324 can be designed that when a logical high signal is fed to the DVLT selection logic 324, the tracking control circuit 304 is selected through the logic 328 and the reference bit line 334. On the other hand, for example, when a logical low signal is fed to the DVLT selection logic 324, the tracking control circuit 302 is selected through the logic 326 and the reference bit line 332. The DVLT selection logic 324 can be a pass gate or a combination of logic gates/NMOS/PMOS/inverter devices.

The tracking control circuits 302 and 304 are designed for the SRAM memory unit 300 to work at two distinct voltages. For example, the tracking control circuit 302 may be designed to work at 2 Volts, and the tracking control circuit 304 may be designed to work at 400 millivolts. In this example, the tracking control circuit 304 may configure, for example, to select three tracking cells, while the tracking control circuit 302 may configure, for example, to select eight tracking cells. As mentioned previously, this is because that for a higher voltage, it will take a longer time to fall from a logical high level to a logical low level, or to rise from a logical low level to a logical high level, thus more tracking cells are necessary in order to maintain optimum speed.

Figure 4:
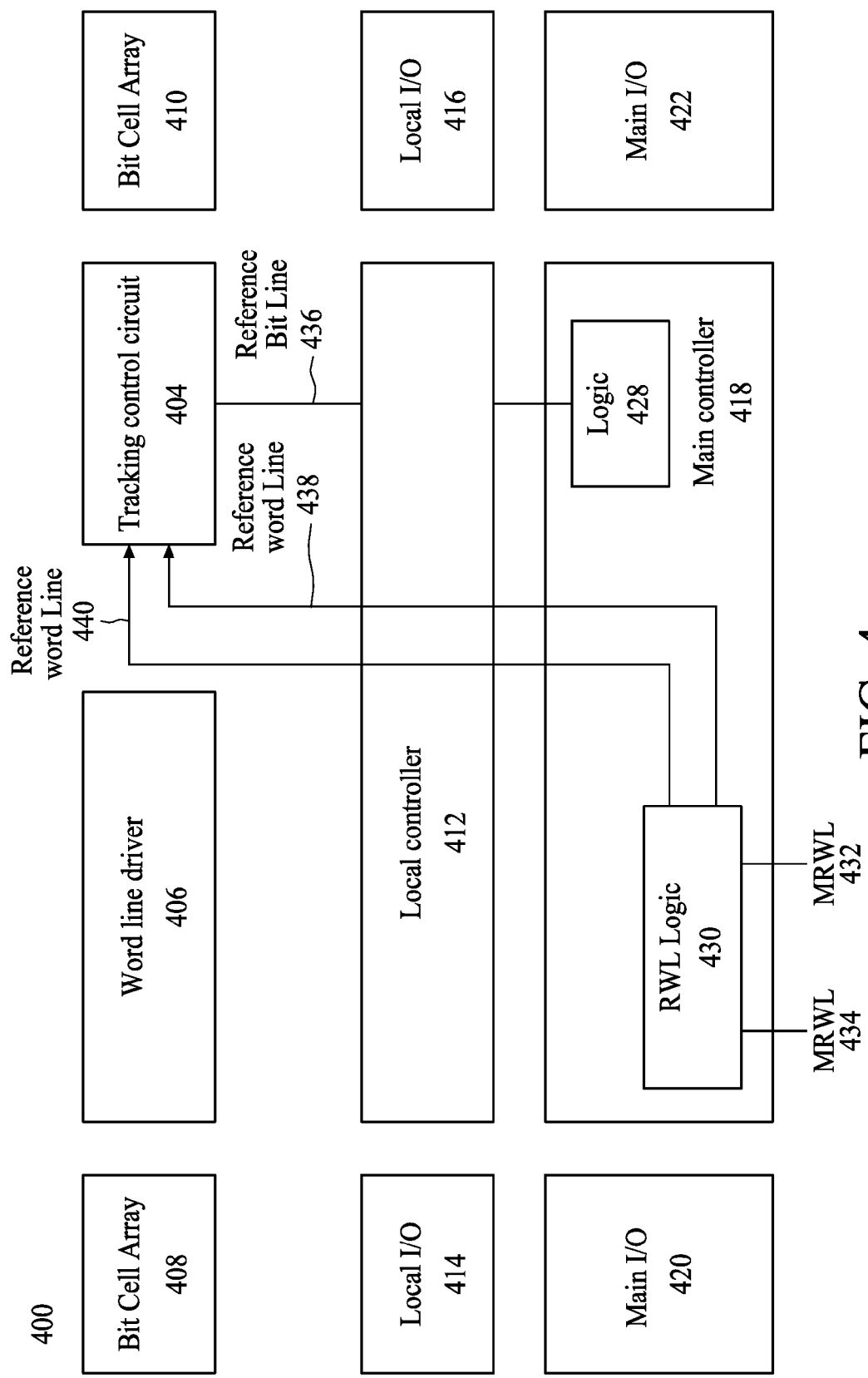
FIG. 4 is a schematic diagram of an SRAM memory unit that is able to work at two distinct voltages, in accordance with some embodiments of the subject application.

FIG. 4 is a schematic diagram of an SRAM memory unit 400 that is able to work at two distinct voltages, in accordance with some embodiments of the subject application. Referring to FIG. 4, the SRAM memory unit 400 comprises a single tracking control circuit 404 and two reference word lines (RWLs) 438 and 440. The SRAM memory unit 400 further comprises a word line driver 406, bit cell arrays 408 and 410, a local controller 412, local I/Os 414 and 416, a main controller 418, and main I/Os 420 and 422. The word line driver 406 drives the word line for corresponding bit cells within the bit cell arrays 408 and 410 to be accessed during a read or a write operation. The local controller 412 controls the local I/Os 414 and 416 to transfer data within the SRAM memory unit 400. The main controller 418 controls the main I/Os 420 and 422 to transfer data between the SRAM memory unit 300 and other circuits outside of the SRAM memory unit 400.

A reference word line logic 430 in the main controller 418 enables a user to select either one, or both of the RWL 438 and RWL 440 for the SRAM memory unit 400 to operate. The RWL logic 430 comprises two inputs, multi reference word line (MRWL) 432 and MRWL 434. The RWL 438 and RWL 440 are selected according to Table 1 below. It should be understood that Table 1 is an example showing the relationship between the values of MRWLs 432 and 434 and the RWLs 438 and 440. The selection of RWLs 438 and/or 440 configures the number of tracking cells in the read operation or the write operation of the SRAM memory unit 400. Once the number of RWL is determined (i.e., either only one of RWL 438 or RWL 440 is selected, or both RWLs 438 and 440 are selected), the tracking control circuit 404 is connected to the logic 428 through the reference bit line 436, and generate signals for controlling the write operation and the read operation of the SRAM memory unit 400.

TABLE 1

| MRWL 432 | MRWL 434 | RWL 438 | RWL 440 |
|---|---|---|---|
| 0 | 1 | selected | unselected |
| 1 | 0 | unselected | selected |
| 1 | 1 | selected | selected |

Figure 5:
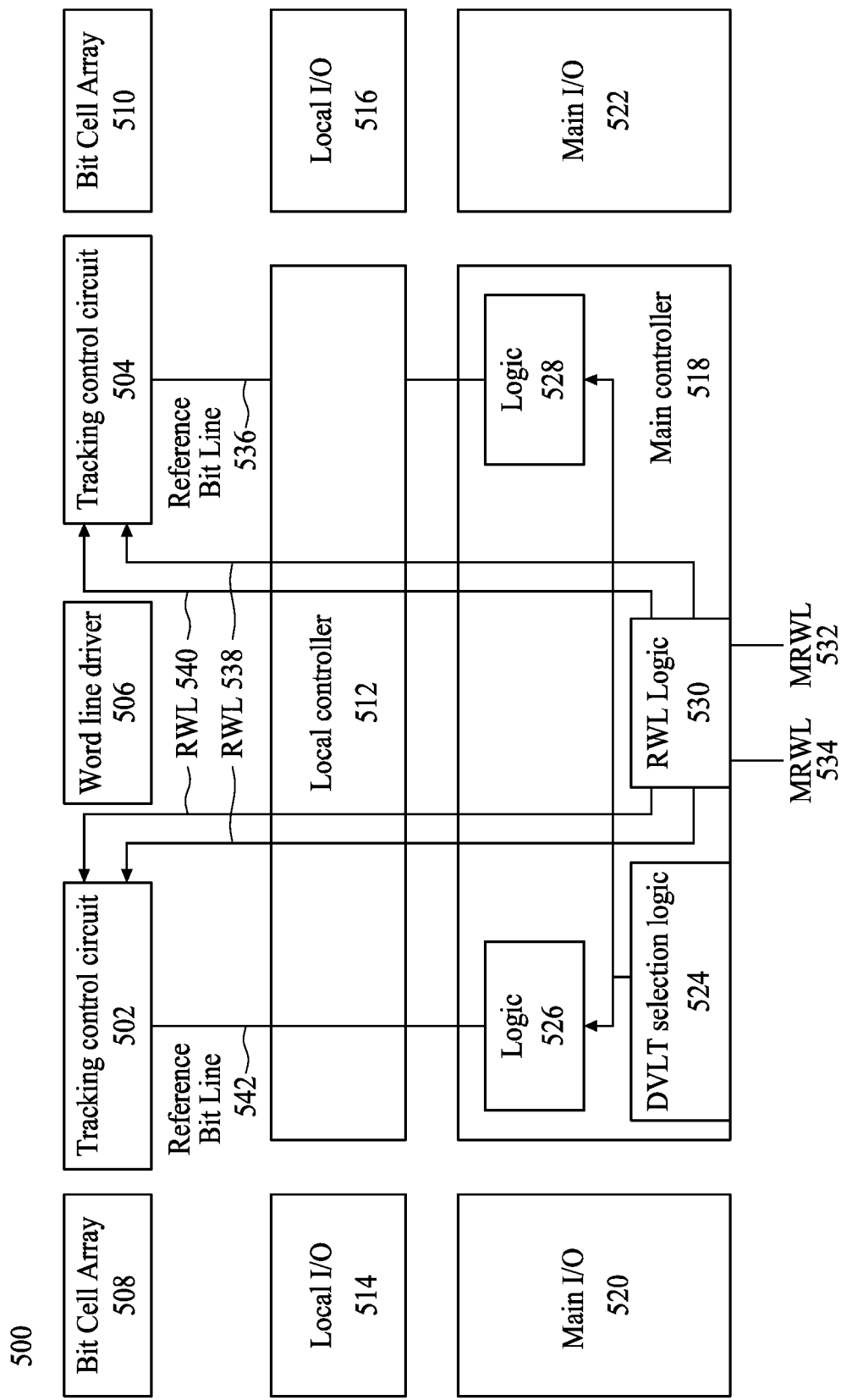
FIG. 5 is a schematic diagram of an SRAM memory unit that is able to work at two distinct voltages, in accordance with some embodiments of the subject application.

FIG. 5 is a schematic diagram of an SRAM memory unit 500 that is able to work at two distinct voltages, in accordance with some embodiments of the subject application. Referring to FIG. 5, the SRAM memory unit 500 comprises two tracking control circuits 502 and 504. Each of the tracking control circuits 502 and 504 comprises two reference word lines (RWLs) 538 and 540. The SRAM memory unit 500 further comprises a word line driver 506, bit cell arrays 508 and 510, a local controller 512, local I/Os 514 and 516, a main controller 518, and main I/Os 520 and 522. The word line driver 506 drives the word line for corresponding bit cells within the bit cell arrays 508 and 510 to be accessed during a read or a write operation. The local controller 512 controls the local I/Os 514 and 516 to transfer data within the SRAM memory unit 500. The main controller 518 controls the main I/Os 520 and 522 to transfer data between the SRAM memory unit 500 and other circuits outside of the SRAM memory unit 500.

A dual voltage (DVLT) selection logic 524 in the main controller 518 enables a user to select one of the tracking control circuits 502 and 504 for the SRAM memory unit 500 to operate. For example, the DVLT selection logic 524 can be designed that when a logical high signal is fed to the DVLT selection logic 524, the tracking control circuit 504 is selected through the logic 528 and the reference bit line 536. On the other hand, for example, when a logical low signal is fed to the DVLT selection logic 524, the tracking control circuit 502 is selected through the logic 526 and the reference bit line 542. The DVLT selection logic 524 can be a pass gate or a combination of logic gates/NMOS/PMOS/inverter devices.

A reference word line logic 530 in the main controller 518 enables a user to select either one, or both of the RWL 538 and RWL 540 to operate with the selected tracking control circuit. The selection of RWLs 538 and/or 540 configures the number of tracking cells in the read operation or the write operation of the SRAM memory unit 500. The RWL 538 and RWL 540 are selected according to Table 2 below. It should be understood that Table 2 is an example showing the relationship between the values of MRWLs 532 and 534 and the RWLs 538 and 540.

TABLE 2

| MRWL 532 | MRWL 534 | RWL 538 | RWL 540 |
|---|---|---|---|
| 0 | 1 | selected | Un-selected |
| 1 | 0 | Un-selected | selected |
| 1 | 1 | selected | selected |

The tracking control circuits 502 and 504 are designed so that the SRAM memory unit 500 is able to work at two distinct voltages. For example, the tracking control circuit 502 may be designed to work at 2 Volts, and the tracking control circuit 504 may be designed to work at 400 millivolts. In this example, the tracking control circuit 504 may configure, for example, to select three tracking cells, while the tracking control circuit 502 may configure, for example, to select eight tracking cells.

The configurable RWLs 538 and 540 can even extend the flexibility of the SRAM memory unit 500. For example, if the tracking control circuit 502 designed to work at 2 Volts is selected, the RWLs 538 and 540 can configure different numbers of tracking cells for respective 2 Volts read operation and write operation. On the other hand, for example, if the tracking control circuit 504 designed to work at 400 millivolts is selected, the RWLs 538 and 540 can configure different numbers of tracking cells for respective 400 millivolts read operation and write operation. Therefore, the SRAM memory unit 500 is able to work at two distinct voltages, and guarantee the correct operations for both read operation and write operation in those two distinct voltages.

Figure 6A:
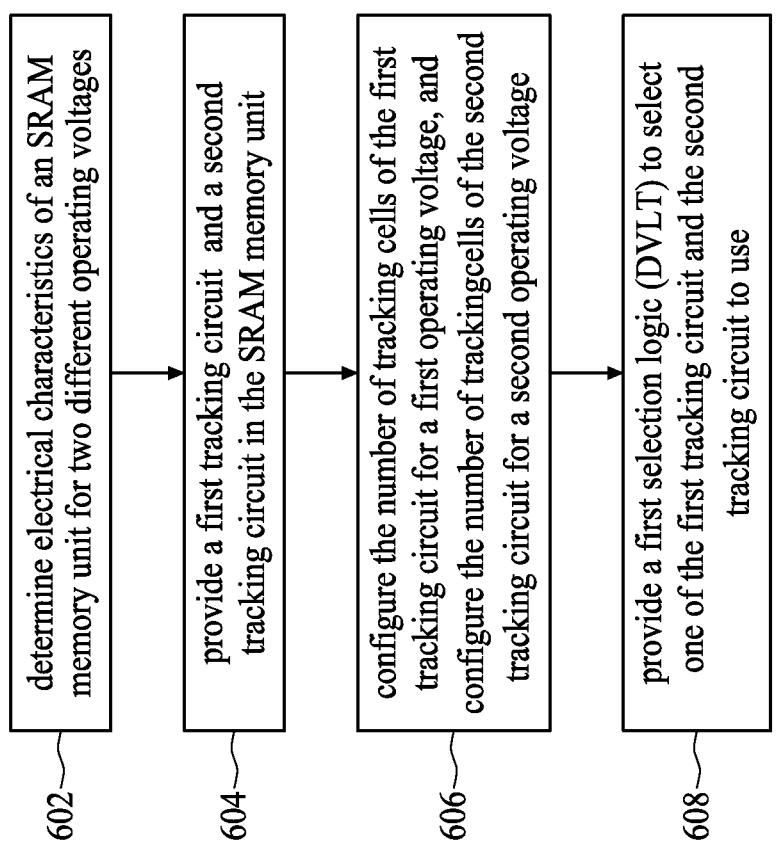
FIG. 6A is a flow chart of configuring an SRAM memory unit to work at two distinct voltages, in accordance with some embodiments of the subject application.

FIG. 6A is a flow chart of configuring an SRAM memory unit to work at two distinct voltages, in accordance with some embodiments of the subject application. In operation 602, electrical characteristics of an SRAM memory unit for different operating voltages are determined. The electric characteristics may include noise margins and operation speeds of the SRAM memory unit for operation at, for example, two different operating voltages.

In operation 604, a first tracking circuit and a second tracking circuit are provided in the SRAM memory unit.

In operation 606, the number of tracking cells of the first tracking circuit is configured for a first operating voltage, and the number of tracking cells of the second tracking circuit is configured for a second operating voltage. The number of tracking cells within the first tracking circuit and the second tracking circuit depends on the electric characteristics such as the noise margins and the operation speeds determined in operation 602 for the first and second operating voltages.

In operation 608, a first selection logic is provided for selecting one of the first tracking circuit and the second tracking circuit to use in the SRAM memory unit.

Figure 6B:
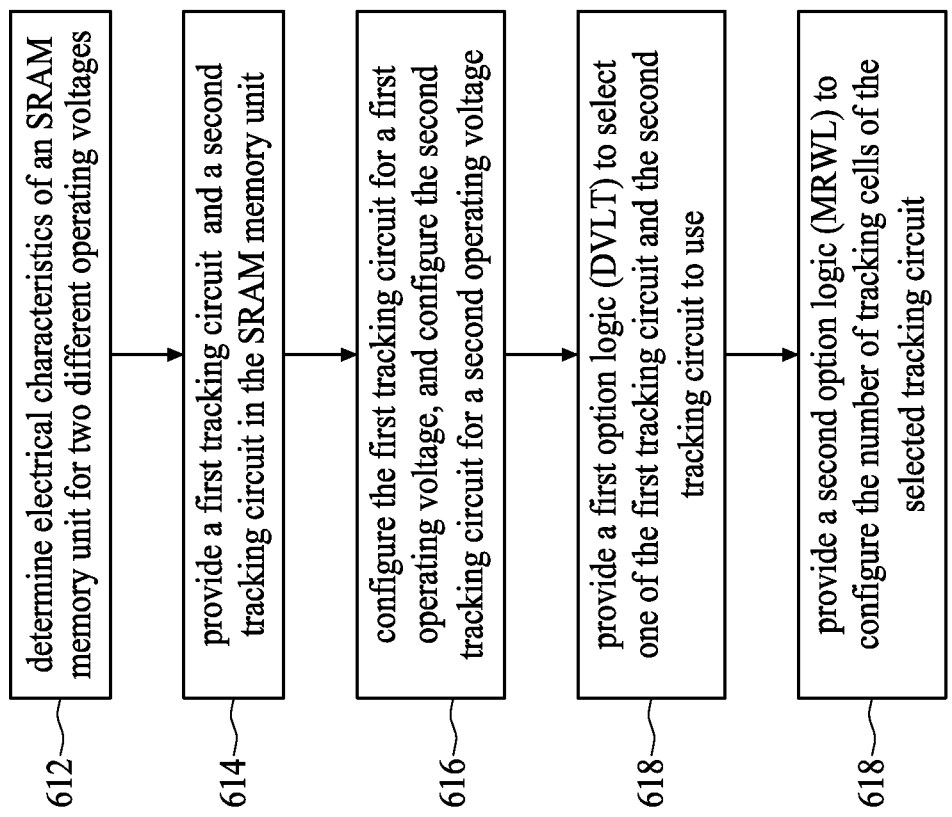
FIG. 6B is a flow chart of configuring an SRAM memory unit to work at two distinct voltages, in accordance with some embodiments of the subject application.

FIG. 6B is a flow chart of configuring an SRAM memory unit to work at two distinct voltages, in accordance with some embodiments of the subject application. In operation 612, electric characteristics such as the noise margins and the operation speeds of an SRAM memory unit for two different operating voltages are determined.

In operation 614, a first tracking circuit and a second tracking circuit are provided in the SRAM memory unit.

In operation 616, the first tracking circuit is configured for a first operating voltage, and the second tracking circuit is configured for a first operating voltage.

In operation 618, a first selection logic is provided for selecting one of the first tracking circuit and the second tracking circuit to use in the SRAM memory unit.

In operation 620, a second selection logic is provided for configuring the number of tracking cells of the selected tracking circuit. The number of tracking cells within the first tracking circuit and the second tracking circuit depends on the electric characteristics such as the noise margins and the operation speeds determined in operation 612. In addition, a different number of tracking cells can be configured for independently controlling read and write operations of the SRAM memory unit.

In an SRAM memory unit, a noise margin is the amount by which the signal exceeds a threshold for a proper logical low or logical high. For example, a digital circuit might be designed to swing between 0 and 1.2 volts. In that case, signals below 0.2 volts are considered to be a logical low, and signals above 1.0 volts are considered to be a logical high. Then the noise margin for a logical low would be the amount that a signal is below 0.2 volts, and the noise margin for a logical high would be the amount by which a signal exceeds 1.0 volt. In simple words, a noise margin is the amount of noise that a SRAM memory unit can withstand.

Figure 7:
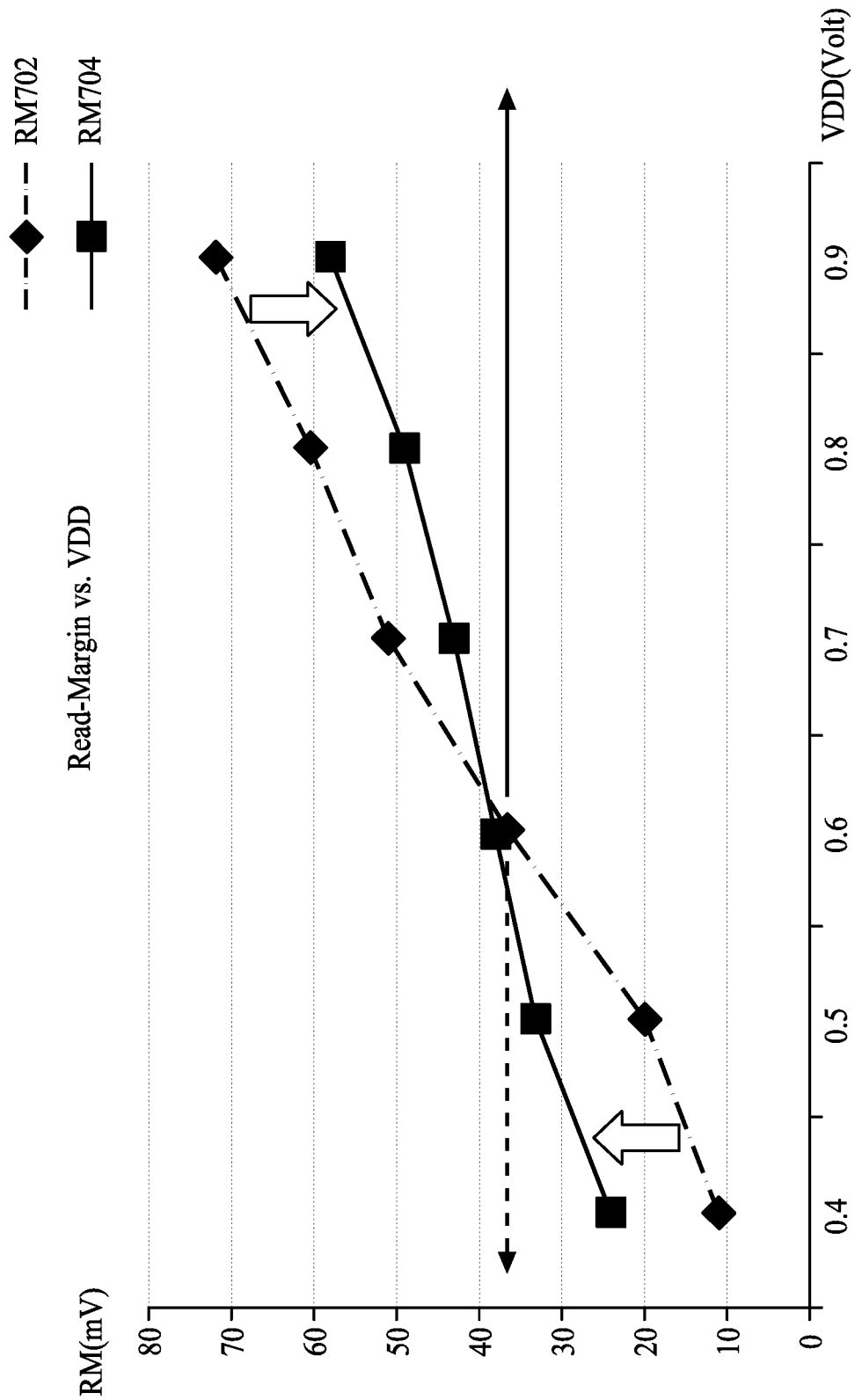
FIG. 7 is a diagram showing a read margin versus a working voltage of an SRAM memory unit, in accordance with some embodiments of the subject application.

FIG. 7 is a diagram showing a read margin versus a working voltage of an SRAM memory unit. Referring to FIG. 7, the read margin refers to the noise margin of the read operation of an SRAM memory unit. The x-axis represents the working voltage (VDD) in volts of the SRAM memory unit. The y-axis represents the read margin in millivolts of the SRAM memory unit. Line 702 shows the read margin characteristics of an existing SRAM memory unit without a tracking control circuit, and line 704 shows the read margin characteristics of an SRAM memory unit in accordance with some embodiments of the subject application.

FIG. 7 can be better understood if we divide the working voltage into two categories: working voltages below 0.6 volts and working voltages above 0.6 volts. For working voltages below 0.6 volts, in order to enhance the accuracy of a read operation, it would be desired to increase the read margin. Utilizing the embodiments illustrated in FIG. 1 to FIG. 5, a tracking control circuit of an SRAM memory unit may be configured to decrease the number of tracking cells. As compared with the existing approach represented by line 702, the read margins at the working voltages 0.4 volts and 0.5 volts of the line 704 are increased.

For working voltages above 0.6 volts, compared with the access speed, the read margin is not of great concern for an SRAM memory unit. In this case, utilizing the embodiments illustrated in FIG. 1 to FIG. 5, a tracking control circuit of an SRAM memory unit may be configured to increase the number of tracking cells. Therefore, the speed of the read operation can be enhanced. FIG. 7 only shows the read margin comparison between an existing SRAM memory unit and an SRAM memory unit in accordance with the subject application. However, it should be understood that the write margin of an SRAM memory unit can also be improved, according to a manner similar to those previously described.

Embodiments of the present disclosure provide methods for operating a memory device in at least one operation voltage. Embodiments of the present disclosure also provide memory devices for operating in at least one operation voltage. The methods and memory devices provided increase the flexibility of the usage of an SRAM memory unit without significant area impact of the memory structure. The methods and memory devices provided also enhance the accuracy of respective read operation and write operation of an SRAM memory unit. The methods and memory devices provided also extend the range of workable operating voltage of an SRAM memory unit.

Embodiments of the present disclosure provide a method for operating a memory device in at least one operation voltage. The method comprises: determining electric characteristics of the memory device in the at least one operation voltage; and providing at least one tracking control circuit in the memory device. The at least one tracking control circuit comprising a plurality of tracking cells, the timing characteristics of the tracking cells emulate the timing characteristics of a bit cell during a write operation or a read operation of the memory device. The method further comprises configuring the number of tracking cells of the at least one tracking control circuit; and providing a first selection circuit for selecting one of the at least one tracking control circuit.

Embodiments of the present disclosure also provide a memory device for operating in at least one operation voltage. The memory device comprises: a tracking control circuit for controlling the write operation or the read operation of the memory device. The tracking control circuit comprising a plurality of tracking cells, wherein the timing characteristics of the tracking cells emulate the timing characteristics of a bit cell during a write operation or a read operation of the memory device. The memory device further comprises at least two reference word lines for configuring the number of tracking cells of the tracking control circuit; and a selection circuit configured to activate one or more of the at least two reference word lines.

Embodiments of the present disclosure also provide a memory device for operating in at least one operation voltage. The memory device comprises: at least one tracking control circuit for controlling a write operation or a read operation of the memory device; and a first selection circuit for activating one of the at least one tracking control circuit. The at least one tracking control circuit of the memory device each comprises a plurality of tracking cells, and the timing characteristics of the tracking cells emulate the timing characteristics of a bit cell during the write operation or the read operation of the memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for operating a memory device, the method comprising:
    providing a tracking control circuit in the memory device, the tracking control circuit including a plurality of tracking cells;
    configuring a first number of tracking cells within the tracking control circuit;
    configuring a second number of tracking cells within the tracking control circuit; and
    activating the first number, the second number or a combination of the first number and the second number of tracking cells within the tracking control circuit;
    wherein the first number of tracking cells are different from the second number of tracking cells.

2. The method of claim 1, wherein the first number is different from the second number.

3. The method of claim 1, wherein the act of configuring the first number of tracking cells within the tracking control circuit comprises:
    configuring the first number of tracking cells within the tracking control circuit according to a timing characteristic of the memory device during a read operation.

4. The method of claim 1, wherein the act of configuring the second number of tracking cells within the tracking control circuit comprises:
    configuring the second number of tracking cells within the tracking control circuit according to a timing characteristic of the memory device during a write operation.

5. The method of claim 1, wherein the act of configuring the first number of tracking cells within the tracking control circuit comprises:
    configuring the first number of tracking cells within the tracking control circuit according to a timing characteristic of the memory device at a first operating voltage.

6. The method of claim 4, wherein the act of configuring the second number of tracking cells within the tracking control circuit comprises:
    configuring the second number of tracking cells within the tracking control circuit according to a timing characteristic of the memory device at a second operating voltage.

7. The method of claim 6, wherein the first operating voltage is different from the second operating voltage.

8. A memory device, comprising:
    a tracking control circuit including a plurality of tracking cells, wherein the tracking cells includes:
        a first number of tracking cells, and
        a second number of tracking cells;
    a selection circuit configured for activating the first number, the second number or a combination of the first number and the second number of tracking cells within the tracking control circuit;
    wherein the first number of tracking cells are different from the second number of tracking cells.

9. The memory device of claim 8, wherein the first number is different from the second number.

10. The memory device of claim 8, wherein the tracking control circuit is configured to ensure sufficient time for a read operation of the memory device, and the first number of tracking cells within the tracking control circuit is configured according to a timing characteristic of the memory device during the read operation.

11. The memory device of claim 8, wherein the tracking control circuit is configured to ensure sufficient time for a write operation of the memory device, and the second number of tracking cells within the tracking control circuit is configured according to a timing characteristic of the memory device during the write operation.

12. The memory device of claim 8, wherein the first number of tracking cells within the tracking control circuit is configured according to a timing characteristic of the memory device at a first operating voltage.

13. The memory device of claim 12, wherein the second number of tracking cells within the tracking control circuit is configured according to a timing characteristic of the memory device at a second operating voltage.

14. The memory device of claim 13, wherein the first operating voltage is different from the second operating voltage.

15. A memory device, comprising:
    a first tracking control circuit, wherein the first tracking control circuit includes a plurality of tracking cells, the tracking cells of the first tracking control circuit including:
        a first number of tracking cells, and
        a second number of tracking cells;
    wherein the first number of tracking cells are different from the second number of tracking cells;

a second tracking control circuit, wherein the second tracking control circuit includes a plurality of tracking cells, the tracking cells of the second tracking control circuit including:
   a third number of tracking cells, and
   a fourth number of tracking cells;
   wherein the third number of tracking cells are different from the fourth number of tracking cells;
a first selection circuit for activating the first tracking control circuit or the second tracking control circuit; and
a second selection circuit configured for activating the number of tracking cells within the activated tracking control circuit.

16. The memory device of claim 15, wherein the first number is different from the second number, and the third number is different from the fourth number.

17. The memory device of claim 15, wherein the first number of tracking cells within the first tracking control circuit is configured according to a timing characteristic of the memory device during a read operation at a first operating voltage.

18. The memory device of claim 15, wherein the second number of tracking cells within the first tracking control circuit is configured according to a timing characteristic of the memory device during a write operation at a first operating voltage.

19. The memory device of claim 15, wherein the third number of tracking cells within the second tracking control circuit is configured according to a timing characteristic of the memory device during a read operation at a second operating voltage, wherein the second operating voltage is different from the first operating voltage.

20. The memory device of claim 15, wherein the fourth number of tracking cells within the first tracking control circuit is configured according to a timing characteristic of the memory device during a write operation at a second operating voltage.

* * * * *